(12) United States Patent  
Takemura

(10) Patent No.: US 8,982,607 B2
(45) Date of Patent: Mar. 17, 2015

(54) MEMORY ELEMENT AND SIGNAL PROCESSING CIRCUIT

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 128 days.

(21) Appl. No.: 13/608,512

(22) Filed: Sep. 10, 2012

(65) Prior Publication Data

US 2013/0083588 A1 Apr. 4, 2013

(30) Foreign Application Priority Data

Sep. 30, 2011 (JP) ................. 2011-216194

(51) Int. Cl.
*G11C 11/24* (2006.01)
*G11C 11/413* (2006.01)
*G11C 11/40* (2006.01)
*G11C 11/412* (2006.01)

(52) U.S. Cl.
CPC .............. *G11C 11/413* (2013.01); *G11C 11/40* (2013.01); *G11C 11/24* (2013.01); *G11C 11/4125* (2013.01)
USPC .......................... 365/149; 365/154; 365/189.2

(58) Field of Classification Search
CPC ...... G11C 11/24; G11C 11/40; G11C 11/401; G11C 11/404; G11C 11/4085; G11C 11/4091; G11C 11/412; G11C 11/4125; G11C 7/065
USPC ...................................... 365/149, 154, 189.2
See application file for complete search history.

(56) References Cited

U.S. PATENT DOCUMENTS

| | | | |
|---|---|---|---|
| 5,327,376 A | * | 7/1994 | Semi ........................... 365/154 |
| 5,353,255 A | | 10/1994 | Komuro |
| 5,495,440 A | | 2/1996 | Asakura |
| 5,731,856 A | | 3/1998 | Kim et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Takeshi Hamamoto et al.; "Cell-Plate-Line/Bit-Line Complementary Sensing (CBCS) Architecture for Ultra Low-Power DRAM's"; IEEE Journal of Solid-State Circuits; Apr. 1996; pp. 592-601; vol. 31, No. 4.

(Continued)

*Primary Examiner* — Tan T. Nguyen
(74) *Attorney, Agent, or Firm* — Fish & Richardson P.C.

(57) ABSTRACT

In a memory element including a pair of inverters, a capacitor which holds data, and a switching element which controls accumulating and releasing of electric charge of the capacitor are provided. For example, one electrode of the capacitor is connected to a first node, which is an input or output terminal of one of the pair of inverters, and the other electrode of the capacitor is connected to one electrode the switching element. The other electrode of the switching element is connected to a second node, which is the output or input terminal of the one of the pair of inverters. With such a connection structure, the absolute value of the potential difference between the first node and the second node at the time of data restoring can be large enough, whereby errors at the time of data restoring can be reduced.

22 Claims, 8 Drawing Sheets

(56) References Cited

U.S. PATENT DOCUMENTS

| | | |
|---|---|---|
| 5,744,864 A | 4/1998 | Cillessen et al. |
| 5,764,562 A | 6/1998 | Hamamoto |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,443,749 B2 * | 10/2008 | Forbes .......................... 365/205 |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,772,053 B2 | 8/2010 | Kameshiro et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0185085 A1 | 10/2003 | Kaneko |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0196689 A1 * | 10/2004 | Ohtsuka et al. ................ 365/154 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170023 A1 | 8/2006 | Nikaido et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0175062 A1 | 7/2009 | Houston et al. |
| 2009/0278122 A1 | 11/2009 | Hosono et al. |
| 2009/0280600 A1 | 11/2009 | Hosono et al. |
| 2009/0291538 A1 | 11/2009 | Mise et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0176357 A1 | 7/2011 | Koyama et al. |
| 2011/0187410 A1 | 8/2011 | Kato et al. |
| 2011/0193078 A1 | 8/2011 | Takemura |
| 2012/0032730 A1 | 2/2012 | Koyama |
| 2012/0257440 A1 | 10/2012 | Takemura |
| 2012/0262982 A1 | 10/2012 | Takemura |
| 2012/0275213 A1 | 11/2012 | Takemura |
| 2012/0287701 A1 * | 11/2012 | Takemura ..................... 365/149 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Office Action (U.S. Appl. No. 13/465,227) Dated May 29, 2014.

Asakuma.N. et al., "Crystallization and Reduction of Sol-Gel-Derived Zinc Oxide Films by Irridation with Ultraviolet LAMP", Journal of Sol-Gel Science and Technology, 2003, vol. 26, pp. 181-184.

Asaoka.Y et al., "29.1:Polarizer-Free Reflective LCD Combined with Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin FIlm Transistors for Amoled Back-Plane", SID Digest '09: SID International Symposium Digest of Technical Papers, May 31, 2009, pp. 280-283.

(56) References Cited

OTHER PUBLICATIONS

Clark.S et al., "First Principles Methods Using CASTEP", Zeitschrift fur Kristallographie, 2005, vol. 220, pp. 567-570.

Coasted.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09: SID International Symposium Digest of Technical Papers May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1 pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA Amoled Display Driven by Indium—Gallium—Zinc Oxide TFTS Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission Amoled Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N. et al., "Spinel,YBFE2O4, and YB2FE3O7 Types of Structures for Compounds in the IN2O3 and SC2O3-A2O3-BO Systems [A; FE, GA or AL; B: MG, MN, FE, NI, CU, or ZN]At Temperatures over 1000°C", Journal of Solid State Chemistry, 1985, vol. 60, pp. 382-384.

Kimizuka.N. et al., "Syntheses and Single-Crystal Data of Homologous Compounds, In2O3(ZnO)m (m= 3, 4, and 5), InGaO3(ZnO)3, and Ga2O3(ZnO)m(m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size Amoled Displays", IDW '08: Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No, 5623, pp. 1269-1272.
Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.
Oba.F. et al., "Defect energetics in ZnO: A hybrid Hartree-Fock density functional study", Phys. Rev. B (Physical Review.B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 IN. QVGA Amoled Display Using In—Ga—Zn—Oxide TFTs With a Novel Passivation Layer", SID Digest '09: SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J. et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol.B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104.3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S. et al., "Challenge to Future Displays: Transparent AM-OLED Driven by Pealed Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.
Son.K. et al., "42.4L: Late-News Paper: 4 Inch QVGA AMOLED Driven by the Threshold Voltage Controlled Amorphous GiZo (Ga2O3—In2O3—ZnO) TFT", SID Digest '08: SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.
Tsuda.K et al., "Ultra Low Power Consumption Technologies of Mobile TFT-LCDs". IDW '02: Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

Pre-Charging

Discharging

Amplifying

MEMORY ELEMENT AND SIGNAL PROCESSING CIRCUIT

BACKGROUND OF THE INVENTION

1. Field of the Invention

The present invention relates to a memory element including a semiconductor device and a signal processing circuit including the memory element.

2. Description of the Related Art

Transistors including amorphous silicon, polysilicon, microcrystalline silicon, or the like have been used for display devices such as liquid crystal displays conventionally. Nowadays, techniques in which such transistors are utilized for semiconductor integrated circuits are proposed (e.g., see Patent Document 1).

In recent years, a metal oxide having semiconductor characteristics, which is called oxide semiconductor, has attracted attention. The metal oxide is used for a variety of applications. For example, indium oxide is a well-known metal oxide and used as a material of a transparent electrode included in a liquid crystal display device or the like. Examples of metal oxides having semiconductor characteristics include tungsten oxide, tin oxide, indium oxide, and zinc oxide. A transistor in which such a metal oxide having semiconductor characteristics is used for a channel formation region has been known (see Patent Documents 2 and 3).

Furthermore, a technique for reducing power consumption by shutting down power supply of a flip-flop circuit, which is enabled by saving data stored in the flip-flop circuit, in a memory element composed of a capacitor and a transistor including an oxide semiconductor, has been disclosed (see Patent Document 4). The saving is performed with the use of extremely small leakage current in an off state (off-state current) of the transistor including an oxide semiconductor.

REFERENCE

Patent Document

[Patent Document 1] U.S. Pat. No. 7,772,053
[Patent Document 2] United States Patent Application Publication No. 2007/0072439
[Patent Document 3] United States Patent Application Publication No. 2011/0193078
[Patent Document 4] United States Patent Application Publication No. 2011/0187410

SUMMARY OF THE INVENTION

A signal processing circuit such as a central processing unit (CPU) has a variety of configurations depending on its application but is generally provided with various semiconductor memory devices (hereinafter simply referred to as memory devices) such as a register and a cache memory as well as a main memory for storing data or a program. A register has a function of temporarily holding data for carrying out arithmetic processing, holding a program execution state, or the like. In addition, a cache memory is provided in a CPU so as to be located between an arithmetic unit and a main memory in order to reduce access to the main memory and speed up the arithmetic processing.

In a memory device such as a register or a cache memory, data writing needs to be performed at higher speed than operation in a main memory. Therefore, in each memory device, a memory element including an inverter or a flip-flop circuit, which is a combination of inverters, is used.

FIG. 2A illustrates a memory element described in Patent Document 4. A memory element 200 illustrated in FIG. 2A includes an inverter 201, an inverter 202, a switching element 203, and a switching element 204.

Input of a signal IN to an input terminal of the inverter 201 is controlled by the switching element 203. A potential of an output terminal of the inverter 201 is supplied to a circuit of a subsequent stage as a signal OUT. The output terminal of the inverter 201 is connected to an input terminal of the inverter 202, and an output terminal of the inverter 202 is connected to the input terminal of the inverter 201 via the switching element 204.

When the switching element 203 is turned off and the switching element 204 is turned on, a potential of the signal IN which is input via the switching element 203 is held in the memory element 200.

A specific circuit configuration of the memory element 200 of FIG. 2A is illustrated in FIG. 2B. The memory element 200 illustrated in FIG. 2B includes the inverter 201, the inverter 202, the switching element 203, and the switching element 204, and the connection structure of these circuit elements is the same as that in FIG. 2A.

The inverter 201 includes a p-channel transistor 207 and an n-channel transistor 208 whose gate electrodes are connected to each other. In addition, the p-channel transistor 207 and the n-channel transistor 208 are connected in series between a node to which the potential VDD is applied and a node to which the potential VSS is applied.

In a similar manner, the inverter 202 includes a p-channel transistor 209 and an n-channel transistor 210 whose gate electrodes are connected to each other. The p-channel transistor 209 and the n-channel transistor 210 are connected in series between a node to which the potential VDD is applied and a node to which the potential VSS is applied.

The inverter 201 illustrated in FIG. 2B operates such that one of the p-channel transistor 207 and the n-channel transistor 208 is turned on and the other is turned off according to the level of potentials supplied to the gate electrodes thereof. Thus, the current between the node to which the potential VDD is applied and the node to which the potential VSS is applied should be ideally zero.

However, actually a minute amount of current (off-state current) flows between a source and a drain, between a gate and the source, or between the gate and the drain in the off-state transistor; therefore, the current between the nodes cannot be completely zero. A similar phenomenon also occurs in the inverter 202. Therefore, power is consumed in the memory element 200 even in a state where data writing is not performed.

In the case of an inverter manufactured with bulk silicon (in the case where the channel length of the transistor is 160 nm), an off-state current of about 0.1 pA is generated at room temperature at a voltage between the nodes of about 1 V, for example. The memory element illustrated in FIGS. 2A and 2B includes two inverters: the inverter 201 and the inverter 202; therefore, an off-state current of about 0.2 pA is generated. In the case of a register including about $10^7$ memory elements, the off-state current of the register is 2 µA.

Further, since the thickness of a gate insulator is reduced in accordance with progress of miniaturization, the amount of gate leakage current flowing between a gate and a channel through the gate insulator positioned therebetween becomes too large to ignore. These factors also increase the power consumption of the register along with a reduction in size of an IC chip. Heat generated by consuming power causes an increase in temperature of the IC chip, and then power consumption is further increased, which results in a vicious circle.

Like the register, an SRAM also includes an inverter, and thus power is consumed due to the off-state current of a transistor. As described above, as in the case of the register, power is consumed in a cache memory including the SRAM even in a state where data writing is not performed.

In order to reduce power consumption, a method for temporarily stopping the supply of a power supply potential to a memory device in a period during which data is not input and output has been suggested. In a register and a cache memory with the above structure, data is erased when the supply of a power supply potential is stopped. Therefore, a nonvolatile memory device is provided around the memory device and the data is temporarily transferred to the nonvolatile memory device. However, since such a nonvolatile memory device is mainly formed using a magnetic element or a ferroelectric, the manufacturing process is complex.

In addition, in the case where the power supply is stopped for a long time in a CPU, data in a memory device is transferred to an external memory device such as a hard disk or a flash memory before the power supply is stopped, so that the data can be prevented from being erased. However, it takes time to place the data back in a register, a cache memory, and a main memory from such an external memory device. Therefore, back up of data using the external memory device such as a hard disk or a flash memory is not suitable for the case where the power supply is stopped for a short time (e.g., for 100 microseconds to one minute) for reducing power consumption.

Patent Document 4 suggests a method of restoring data in the following manner: a capacitor 205 and a capacitor switching element 206 are provided; data stored in a flip-flop circuit is transferred as electric charge in accordance with the data to the capacitor 205 by turning on the capacitor switching element 206; the capacitor switching element 206 is turned off and then power supply to the flip-flop circuit is stopped; the power supply is resumed and then the capacitor switching element 206 is turned on; and thus, the electric charge accumulated in the capacitor 205 is supplied to a first node N1 of the flip-flop circuit.

In the case where an oxide semiconductor is used for a channel formation region of the capacitor switching element 206, off-state current can be reduced to be smaller than one millionth of off-state current in the case where bulk silicon is used for the channel formation region, so that electric charge accumulated in the capacitor 205 can be held for a sufficiently long period.

In recent years, there is also a problem in that as miniaturization of a circuit progresses, variations in threshold between transistors become significant. In particular, variations in threshold between transistors included in a flip-flop circuit become large, variations in the range of voltage which flip-flop circuits can stably hold become large. As a result, the range of stable operation voltage narrows in the case where a plurality of flip-flop circuits are integrated.

In the memory element illustrated in FIGS. 2A and 2B, when data is restored in the case where the range of stable operation voltage is not sufficiently wide, the absolute value of a potential difference between the first node N1 and a second node N2 is preferably large. This is because when neither a potential of the first node N1 nor a potential of the second node N2 are in the range of stable operation voltage, the data restoring may result in failure.

In view of the above-described problems, an object of one embodiment of the present invention is to provide a memory element having a circuit configuration with which data can be stably restored, a signal processing circuit including the memory element. In particular, an object is to provide a memory element whose power consumption can be suppressed by stopping the power supply for a short time, a signal processing circuit including the memory element.

In a memory element including two or more inverters (including a clocked inverter), a capacitor which holds data and a capacitor switching element which controls accumulating and releasing of electric charge of the capacitor are provided. One electrode of the capacitor is connected to a node (a first node) of any one of the inverters, and the other electrode of the capacitor is connected to a source or drain of the capacitor switching element. The drain or source of the capacitor switching element is connected to a node (a second node) whose phase is opposite to that of the first node in the memory element.

The memory element is used for a signal processing circuit including a register, a cache memory, or the like. In that case, with use of an oxide semiconductor for a channel formation region, a transistor whose off-state current is extremely small can be manufactured. In formation of a memory element or a signal processing circuit, such a transistor whose off-state current is extremely small is used as the capacitor switching element, so that error of data restoring can be reduced in addition to a reduction in power consumption.

In the case where an oxide semiconductor is used for a channel formation region of the capacitor switching element, the channel length is greater than or equal to ten times, preferably greater than or equal to 20 times, more preferably greater than or equal to 50 times of the minimum feature size. Alternatively, the channel length is greater than or equal to 0.2 μm, preferably greater than or equal to 0.4 μm, more preferably greater than or equal to 1 μm. At this time, the effective thickness of the gate insulator (the physical thickness of the gate insulator×the dielectric constant of the oxide semiconductor/the dielectric constant of the gate insulator) is preferably less than or equal to 10% of the channel length.

Note that a semiconductor used for the capacitor switching element is not limited to an oxide semiconductor, and may be silicon or another material as long as electric charge can be stored in the capacitor for a desired time. For example, in the case where the time for which data is stored in the capacitor (time for which a capacitor with a capacitance of 1 fF decreases in voltage from 1 V to 0.9 V) is only one second, the off-state current may be less than or equal to 0.1 fA.

It has been reported that a transistor including an extremely thin silicon film achieves an off-state current of 0.1 fA or lower, and such a transistor can be used (see Patent Document 1). Furthermore, off-state current can be reduced even in a transistor in which the channel length is enough larger than the channel width.

On the other hand, in the case where the time for which data is stored in the capacitor is ten years, an off-state current of 0.1 zA or lower is needed, so that an oxide semiconductor is preferably used. Similarly, in the case where data is stored at a temperature of 100° C. or higher, an oxide semiconductor is preferably used.

The capacitor switching element is preferably formed above an inverter to overlap therewith. An oxide semiconductor layer used in the capacitor switching element has a meandering shape or at least one hollow portion, thereby being formed in a limited area. Accordingly, the above channel length can be achieved.

For example, the above memory element such as a register or an SRAM includes a circuit in which two or more inverters are combined (e.g., a flip-flop circuit). The area occupied by the circuit is 50 $F^2$ (F is the minimum feature size) or more, and generally 100 $F^2$ to 150 $F^2$. For example, in the case where the area occupied by the circuit in which two inverters are combined is 50 $F^2$ and the capacitor switching element including an oxide semiconductor is provided in half the area (25 $F^2$) of the circuit, the channel length can be 25 F on the assumption that the channel width is F. When F is 40 nm, the channel length is 1 μm.

Further, the capacitor is also preferably formed above the inverter to overlap therewith, and may be formed in the same layer as the capacitor switching element or in a different layer from the capacitor switching element. When the capacitor is formed in the same layer as the capacitor switching element, although it is necessary to form a region for the capacitor switching element and a region for the capacitor, the manufacturing process can be simplified. On the other hand, when the capacitor is formed in a different layer from the capacitor switching element, although the number of steps for manufacturing the capacitor is increased, there is an advantage that the integration degree is increased. Thus, a dielectric body of the capacitor can be formed using a different component from a gate insulator of the capacitor switching element; as a result, capacitance can be increased.

The on-resistance of the switching element and the capacitance of the capacitor may be determined in accordance with the speed of the needed switching operation. In the case of stopping or resuming supply of the power, the time for the switching operation may be greater than or equal to 100 microseconds. Further, the off-resistance of the switching element and the capacitance of the capacitor may be determined in accordance with the interval between the needed switching operations.

Further, the signal processing circuit includes various logic circuits such as an arithmetic circuit which transmits/receives data to/from the memory device in addition to the above memory device. Not only the supply of power supply voltage to the memory device but also the supply of power supply voltage to the arithmetic circuit which transmits/receives data to/from the memory device may be stopped.

For example, a memory element of one embodiment of the present invention includes at least a pair of inverters, a capacitor, and a capacitor switching element which controls accumulating and releasing of electric charge in the capacitor. A signal including data that is input to the memory element is supplied to an input terminal of a first inverter. An output terminal of the first inverter is connected to an input terminal of a second inverter. An output terminal of the second inverter is connected to the input terminal of the first inverter. A potential of the output terminal of the first inverter or the input terminal of the second inverter is output to a memory element or another circuit of a subsequent stage as a signal.

Each of the inverters has at least one p-channel transistor and one n-channel transistor which are connected in series, and the gate electrodes thereof are connected to each other.

One electrode of the capacitor is connected to the input terminal of one of inverters so that data of the signal input to the memory element can be stored as needed. The other electrode is connected to the capacitor switching element. The other electrode of the capacitor switching element is connected to the output terminal of the inverter.

In the state where a power supply voltage is applied to the first and second inverters, when the signal including the data is input to the input terminal of the first inverter, the data is held by the first and the second inverters.

In the case where the application of the power supply voltage to the first and second inverters is stopped, before the application of the power supply voltage is stopped, the capacitor switching element is turned on and the data of the signal is stored in the capacitor. With the above-described structure, even when the application of the power supply voltage to the first and second inverters is stopped, data can be held in the memory element.

A channel formation region of a transistor which is used as the capacitor switching element may include a highly-purified oxide semiconductor. In the case where the channel is sufficiently long, the off-state current is extremely small.

In a transistor used in the inverter, an amorphous, microcrystalline, polycrystalline, or single crystal semiconductor without an oxide semiconductor can be used. As a material of such a semiconductor, silicon, germanium, or the like can be given. In addition, for manufacturing the above-described transistor, a thin semiconductor film or a bulk semiconductor may be used.

Note that an oxide semiconductor preferably contains at least indium (In) or zinc (Zn). In particular, In and Zn are preferably contained. As a stabilizer for reducing variation in electric characteristics of a transistor including the oxide semiconductor, gallium (Ga) is preferably contained additionally. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—S—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In, Ga, and Zn. The In—Ga—Zn-based oxide may contain a metal element other than In, Ga, and Zn. The above oxide semiconductor may contain silicon.

Alternatively, an oxide semiconductor can be represented by the chemical formula, $InMO_3(ZnO)_m$ (m>0). Here, M denotes one or more metal elements selected from Sn, Ga, Al, Hf, and Co.

For example, an In—Ga—Zn-based oxide with an atomic ratio where In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio where In:Sn:

Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios can be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, the mobility can be increased by decreasing the defect density in the bulk also in the case of using the In—Ga—Zn-based oxide.

Note that in this specification, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq 0.0025$. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In the case where an oxide semiconductor is in an amorphous state, a flat surface can be obtained with relative ease. Thus, when a transistor is manufactured with use of such an oxide semiconductor, interface scattering can be reduced, and relatively high mobility can be obtained with relative ease.

In an oxide semiconductor having crystallinity, defects in the bulk can be reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

The oxide semiconductor is a metal oxide having a relatively high mobility (greater than or equal to 1 cm$^2$/Vs, preferably greater than or equal to 10 cm$^2$/Vs) as semiconductor characteristics. In addition, an oxide semiconductor which is highly purified by reducing an impurity serving as an electron donors (donor), such as moisture or hydrogen, and by reducing oxygen vacancies is an i-type semiconductor (intrinsic semiconductor, in this specification, a semiconductor having a carrier concentration of $1\times10^{12}$/cm$^3$ or lower is called i-type semiconductor) or a semiconductor extremely close to an i-type semiconductor (a substantially i-type semiconductor).

Specifically, impurities such as moisture or hydrogen included in the oxide semiconductor are preferably removed so that the value of the hydrogen concentration in the oxide semiconductor measured by secondary ion mass spectrometry (SIMS) can be lower than or equal to $5\times10^{19}$/cm$^3$, preferably lower than or equal to $5\times10^{18}$/cm$^3$, more preferably lower than or equal to $5\times10^{17}$/cm$^3$, still more preferably lower than or equal to $1\times10^{16}$/cm$^3$. In addition, oxygen vacancies are preferably reduced as much as possible. The removal of an element which is undesirable for formation of an intrinsic oxide semiconductor refers to high purification.

With the above-described structure, the carrier density of an oxide semiconductor film, which can be measured by Hall effect measurement, can be less than $1\times10^{14}$ cm$^{-3}$, preferably less than $1\times10^{12}$ cm$^{-3}$, more preferably less than $1\times10^{11}$ cm$^{-3}$. That is, the carrier density of the oxide semiconductor film can be extremely close to zero. The band gap of the oxide semiconductor film is greater than or equal to 2 eV and less than or equal to 4 eV, preferably greater than or equal to 2.5 eV and less than or equal to 4 eV, and more preferably greater than or equal to 3 eV and less than or equal to 4 eV. With the use of the highly-purified oxide semiconductor film, the off-state current of the transistor can be reduced.

The analysis of the concentrations of hydrogen in the oxide semiconductor film and a conductive film is described here. The concentration of hydrogen in the oxide semiconductor film and the concentration of hydrogen in the conductive film are measured by SIMS. It is known that it is difficult to obtain accurate data in the proximity of a surface of a sample or in the proximity of an interface between stacked films formed using different materials, by the SIMS in principle.

Thus, in the case where distribution of the hydrogen concentration in the film in the thickness direction is analyzed by SIMS, an average value in a region of the film in which the value is not greatly changed and substantially the same value can be obtained is employed as the hydrogen concentration.

Further, in the case where the thickness of the film is small, a region where almost the same value is obtained cannot be found in some cases due to the influence of the hydrogen concentration of the films adjacent to each other. In this case, the maximum value or the minimum value of the hydrogen concentration of a region where the film is provided is employed as the hydrogen concentration of the film. Furthermore, in the case where a mountain-shaped peak indicating the maximum value and a valley-shaped peak indicating the minimum value do not exist in any region of the film, the value of the inflection point is employed as the hydrogen concentration.

Note that it is found that the oxide semiconductor film formed by sputtering or the like includes a large amount of impurities such as moisture or hydrogen. Moisture and hydrogen easily form a donor level and thus serve as impurities in the oxide semiconductor.

Therefore, in one embodiment of the present invention, in order to reduce impurities such as moisture or hydrogen in the oxide semiconductor film, the oxide semiconductor film is subjected to heat treatment in a reduced pressure atmosphere, an atmosphere of an inert gas such as nitrogen or a rare gas, an oxygen gas atmosphere, or an ultra dry air atmosphere (the moisture amount is less than or equal to 20 ppm (−55° C. by conversion into a dew point), preferably less than or equal to 1 ppm, more preferably less than or equal to 10 ppb, in the case where measurement is performed with use of a dew point meter of a cavity ring down laser spectroscopy (CRDS) system).

The above heat treatment is preferably performed at a temperature from 200° C. to 850° C. inclusive, more preferably from 250° C. to 450° C. inclusive. Note that this heat treatment is performed at a temperature not exceeding the allowable temperature limit of the substrate to be used or components (e.g., wiring or insulating film) which have been formed over the substrate before the formation of an oxide semiconductor. An effect of elimination of moisture or hydrogen by the heat treatment has been confirmed by thermal desorption spectrometry (TDS).

Heat treatment in a furnace or a rapid thermal annealing method (RTA method) is used for the heat treatment. As the RTA method, a method using a lamp light source or a method in which heat treatment is performed for a short time while a substrate is moved in a heated gas can be employed. By the use of the RTA method, it is also possible to make the time necessary for heat treatment shorter than 0.1 hours.

The transistor including the oxide semiconductor film that is highly purified by the above heat treatment or the like as an active layer has an extremely small off-state current. Specifically, when an element has a channel width (W) of $1\times10^6$ μm (a channel length (L) of 1 μm), the off-state current at a voltage between the source electrode and the drain electrode of 1 V can be lower than or equal to the measurement limit of a semiconductor parameter analyzer, i.e., less than or equal to $1\times10^{-13}$ A. In this case, the off-state current per micrometer of the channel width is less than or equal to 100 zA/μm. Accordingly, the transistor including the highly-purified oxide semiconductor film as an active layer has an extremely smaller off-state current than a transistor including silicon having crystallinity.

By using the transistor having the above structure as a capacitor switching element for holding electric charge accumulated in the capacitor, leakage of electric charge from the capacitor can be prevented for a long time; therefore, even without application of power supply voltage, data is not erased but can be held.

In a period during which data is held in the capacitor, the power supply voltage is not necessarily supplied to an inverter; as a result, surplus power consumption due to the off-state current of a transistor used for the inverter can be reduced, and the power consumption of the memory device and further the signal processing circuit including the memory device can be suppressed.

By applying the memory element having the above structure to a memory device such as a register or a cache memory included in a signal processing circuit, data in the memory device can be prevented from being erased owing to the stop of the power supply and error after resumption of power supply can be prevented. Therefore, the power supply can be stopped even for a short time in the signal processing circuit or one or a plurality of logic circuits included in the signal processing circuit. Accordingly, it is possible to provide a signal processing circuit whose power consumption can be suppressed and a method for driving the signal processing circuit whose power consumption can be suppressed.

However, the operations of stopping and resuming supply of power may be extremely slow operation as compared with the clock speed of a logic circuit. In other words, a period of 100 microseconds is enough for a switching operation, and in some cases, the switching time may be a millisecond or longer. This is because a process in which data held in a flip-flop circuit of each memory element is transferred to the capacitor or a process in which data held in the capacitor is transferred to the flip-flop circuit of each memory element can be conducted simultaneously in all the memory elements. Such a low-speed operation causes no defect even in a transistor with a long and narrow channel. The mobility of a semiconductor may be 1 $cm^2$/Vs or higher.

Further, in the capacitor, as the capacitance is high, an error at the time of data restoring is less likely to occur. In contrast, when the capacitance is high, the response speed of a circuit including the capacitor and the capacitor switching element is decreased. However, the operation of stopping and resuming supply of power may be extremely slow operation as compared with the clock speed of a logic circuit as described above. Thus, there is no problem when the capacitance is less than or equal to 1 pF.

In addition, with the above configuration, change in potential is large enough when data is restored from the capacitor, so that the error rate during the data restoring is low, resulting in high reliability of the signal processing circuit.

DETAILED DESCRIPTION OF THE INVENTION

Figure 1A:
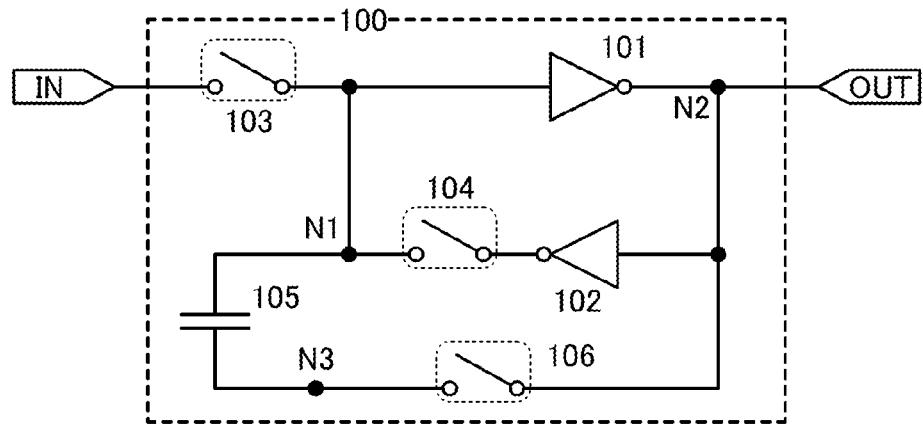
FIGS. 1A and 1B show examples of circuits of a memory element.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the description in the following embodiments.

Note that "connection" in this specification corresponds to a state in which effective direct current can be supplied at least temporarily. Therefore, a state of connection means not only a state of direct connection but also a state of indirect connection via a circuit element such as a wiring or a resistor as long as direct current can be supplied. Note that here, it does not matter whether direct current is actually supplied with the circuit configuration.

On the other hand, in the case where only a capacitor is provided between two nodes, effective direct current cannot be supplied via the capacitor; therefore, the expression that the nodes are "not connected" is used. However, in the case where a switching element is provided between two nodes, direct current can be supplied under a limited condition (i.e., only when the switching element is on); therefore, the expression that the nodes are "connected" is used.

Similarly, in the case where only a diode is provided between two nodes, when one of the nodes has a higher potential than the other, direct current can be supplied; therefore, the expression that the nodes are "connected" is used. In that case, even when potentials with which current cannot be supplied judging from the circuit configuration are applied to the two nodes (at this time, actually, current does not flow between the two nodes via the diode), the expression that the nodes are "connected" is used in this specification.

For example, in the case where a node A is connected to a source of a transistor and a node B is connected to a drain of the transistor, direct current can flow between the node A and the node B depending on the potential of a gate; therefore, the expression that the node A and the node B are "connected" is used.

On the other hand, in the case where the node A is connected to a source of a transistor and a node C is connected to a gate of the transistor, regardless of the potentials of the source, drain, and gate of the transistor, effective direct current cannot flow between the node A and the node C; therefore, the expression that the node A and the node C are "not connected" is used.

The term "effective direct current" means current from which unintended current such as leakage current is subtracted. The value of effective current is not defined by the magnitude (the absolute value), and changes depending on a circuit. In other words, in a certain circuit, a small current of 1 pA can be regarded as effective current, whereas in another circuit, a larger current of 1 μA cannot be regarded as effective current in some cases.

Note that, needless to say, in a circuit having an input terminal and an output terminal (e.g., an inverter), the input terminal and the output terminal are not necessarily connected to each other. Taking an inverter as an example, there is no connection between an input terminal and an output terminal inside the inverter.

Note also that even when a circuit diagram shows independent components as if they are connected to each other, there is a case in which one conductive film has functions of a plurality of components such as a case in which part of a wiring also functions as an electrode. The term "connection" in this specification also means such a case where one conductive film has functions of a plurality of components.

The names of the source (source electrode) and the drain (drain electrode) included in the transistor interchange with each other depending on the polarity of the transistor or the levels of potentials applied to the respective electrodes. In general, in an n-channel transistor, an electrode to which a lower potential is supplied is called a source (source electrode), whereas an electrode to which a higher potential is supplied is called a drain (drain electrode). In a p-channel transistor, an electrode with a low potential is called a drain (drain electrode), whereas an electrode with a high potential is called a source (source electrode).

In this specification, for convenience, connection relation of the transistor is described assuming that the source (source electrode) and the drain (drain electrode) are fixed in some cases; however, actually, the names of the source (source electrode) and the drain (drain electrode) may interchange with each other depending on relation between the above potentials.

Note that in this specification, the state in which the transistors are connected to each other in series means the state in which only one of a source electrode and a drain electrode of a first transistor is connected to only one of a source electrode and a drain electrode of a second transistor. In addition, the state in which the transistors are connected to each other in parallel means the state in which one of a source electrode and a drain electrode of a first transistor is connected to one of a source electrode and a drain electrode of a second transistor and the other of the source electrode and the drain electrode of the first transistor is connected to the other of the source electrode and the drain electrode of the second transistor.

A signal processing circuit of the present invention includes, but is not limited to, in its category an integrated circuit such as a large scale integrated circuit (LSI) including a microprocessor, an image processing circuit, a digital signal processor (DSP), or a microcontroller.

Embodiment 1

A memory device, which is one embodiment of the present invention, includes one or a plurality of memory elements capable of storing 1-bit data. In FIG. 1A, an example of a circuit diagram of a memory element included in a memory device of the present invention is illustrated. A memory element 100 illustrated in FIG. 1A at least includes a first inverter 101 and a second inverter 102 by which the phase of an input signal is inverted and the signal is output, a switching element 103, a switching element 104, a capacitor 105, and a capacitor switching element 106.

A signal IN including data that is input to the memory element 100 is supplied to an input terminal of the first inverter 101 via the switching element 103. An output terminal of the first inverter 101 is connected to an input terminal of the second inverter 102. An output terminal of the second inverter 102 is connected to the input terminal of the first inverter 101 via the switching element 104.

A potential of the output terminal of the first inverter 101 or the input terminal of the second inverter 102 is output to a memory element or another circuit of a subsequent stage as a signal OUT. Here, a node of the input terminal of the first inverter 101 is denoted by a first node N1, and a node of the output terminal of the first inverter 101 is denoted by a second node N2.

Note that in FIG. 1A, an example in which inverters are used as the first inverter 101 and the second inverter 102 is illustrated; however, a clocked inverter can also be used as the first inverter 101 or the second inverter 102 besides the inverter.

The capacitor 105 is connected to an input terminal of the memory element 100, i.e., the first node N1 to which a potential of the signal IN is supplied, so that the data of the signal IN that is input to the memory element 100 can be stored as needed. The capacitor 105 includes a dielectric body between a pair of electrodes. One of the pair of electrodes is connected to the first node N1, and the other electrode is connected to one electrode of the capacitor switching element 106 (in the case where the capacitor switching element 106 is one transistor, the other electrode is connected to either a source electrode or a drain electrode of the capacitor switching element 106). A node at which the capacitor 105 and the capacitor switching element 106 are connected is denoted by a third node N3.

The other electrode of the capacitor switching element 106 is connected to the second node N2. The phase is inverted by the first inverter 101, so that the phase of the potential of the first node N1 is opposite to that of the potential of the second node N2.

For the capacitor switching element 106, a transistor including a highly purified oxide semiconductor in a channel formation region is used.

Note that the memory element 100 may further include another circuit element such as a diode, a resistor, an inductor, or a capacitor, as needed.

Figure 1B:
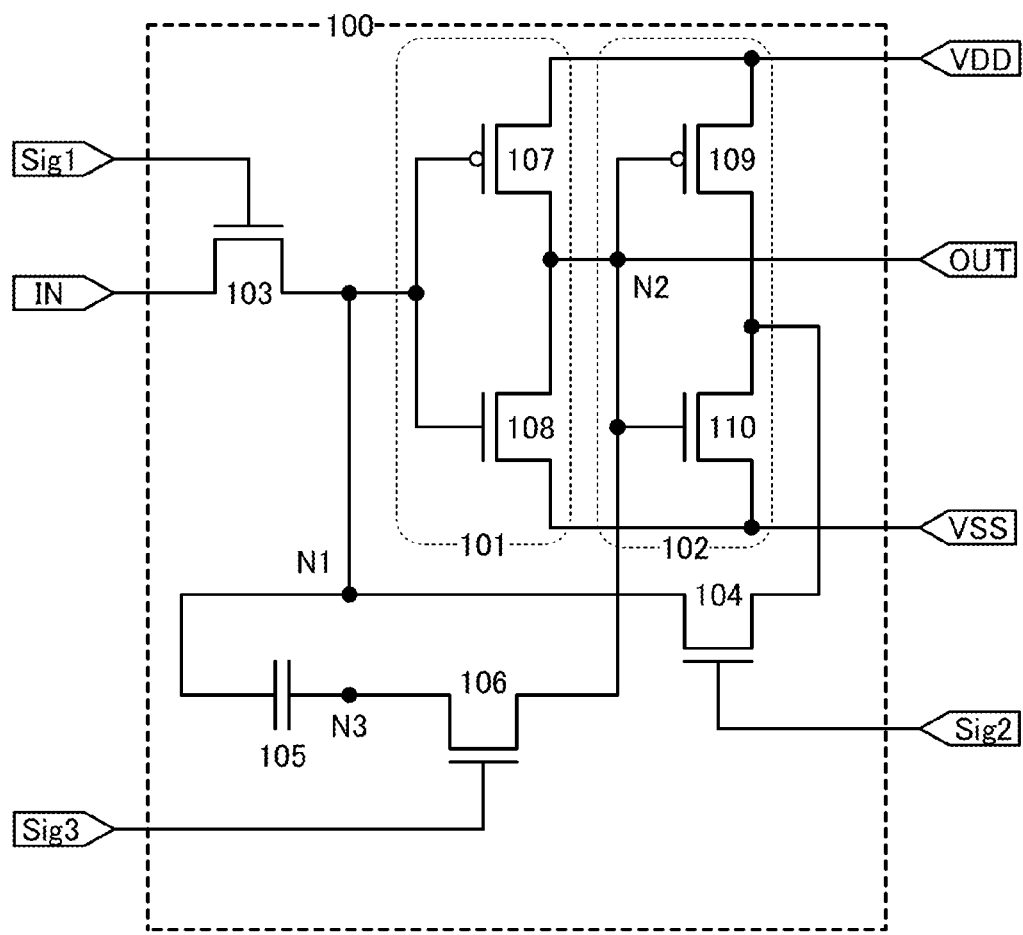

Next, an example of a more specific circuit diagram of the memory element of FIG. 1A is illustrated in FIG. 1B. The memory element 100 illustrated in FIG. 1B includes the first inverter 101, the second inverter 102, the switching element 103, the switching element 104, the capacitor 105, and the capacitor switching element 106. The connection structure of these circuit elements are the same as that in FIG. 1A.

The first inverter 101 in FIG. 1B has a structure in which a p-channel transistor 107 and an n-channel transistor 108 whose gate electrodes are connected to each other are connected in series. Specifically, a source electrode of the p-channel transistor 107 is connected to a node to which the potential VDD is applied, and a source electrode of the n-channel transistor 108 is connected to a node to which the potential VSS is applied.

In addition, a drain electrode of the p-channel transistor 107 is connected to a drain electrode of the n-channel transistor 108, and potentials of the two drain electrodes can be regarded as a potential of the output terminal of the first inverter 101. In addition, potentials of the gate electrode of the p-channel transistor 107 and the gate electrode of the n-channel transistor 108 can be regarded as a potential of the input terminal of the first inverter 101.

The second inverter 102 in FIG. 1B has a structure in which a p-channel transistor 109 and an n-channel transistor 110 whose gate electrodes are connected to each other are connected in series. Specifically, a source electrode of the p-channel transistor 109 is connected to a node to which the potential VDD is applied, and a source electrode of the n-channel transistor 110 is connected to a node to which the potential VSS is applied.

In addition, a drain electrode of the p-channel transistor 109 is connected to a drain electrode of the n-channel transistor 110, and potentials of the two drain electrodes can be regarded as a potential of the output terminal of the second inverter 102. In addition, potentials of the gate electrode of the p-channel transistor 109 and the gate electrode of the n-channel transistor 110 can be regarded as a potential of the input terminal of the second inverter 102.

In FIG. 1B, the case where one transistor is used for the switching element 103 is illustrated as an example, and the switching of the transistor is controlled by a signal Sig1 supplied to a gate electrode thereof. In addition, the case where one transistor is used for the switching element 104 is illustrated as an example, and the switching of the transistor is controlled by a signal Sig2 supplied to a gate electrode thereof Note that in FIG. 1B, a structure in which each of the switching element 103 and the switching element 104 includes only one transistor is illustrated; however, the present invention is not limited to this structure. In one embodiment of the present invention, the switching element 103 or the switching element 104 may include a plurality of transistors.

In the case where a plurality of transistors which serve as switching elements are included in the switching element 103 or the switching element 104, the plurality of transistors may be connected to each other in parallel, in series, or in combination of parallel connection and series connection.

In the case where a plurality of transistors is connected in parallel, polarity thereof may be different. For example, a so-called transfer gate structure in which an n-channel transistor and a p-channel transistor are connected in parallel may be employed.

In FIG. 1B, a transistor including an oxide semiconductor in a channel formation region is used for the capacitor switching element 106, and the switching of the transistor is controlled by a signal Sig3 supplied to a gate electrode thereof. The transistor used for the capacitor switching element 106 includes a highly purified oxide semiconductor in the channel formation region. The channel length is ten times as large as the minimum feature size or more, preferably 20 times as large as the minimum feature size or more, more preferably 50 times as large as the minimum feature size or more, or larger than or equal to 0.2 μm, preferably larger than or equal to 0.4 μm, more preferably larger than or equal to 1 μm. Therefore, the off-state current of the transistor can be extremely small as described above.

In FIG. 1B, a structure in which the capacitor switching element 106 includes only one transistor is illustrated; however, the present invention is not limited to this structure. In one embodiment of the present invention, the capacitor switching element 106 may include a plurality of transistors. In the case where a plurality of transistors which serve as switching elements are included in the capacitor switching element 106, the plurality of transistors may be connected to each other in parallel, in series, or in combination of parallel connection and series connection.

The transistors used for the first inverter 101, the second inverter 102, the switching element 103, and the switching element 104 can include a semiconductor other than an oxide semiconductor, e.g., an amorphous, microcrystalline, polycrystalline, or single crystal semiconductor can be used. As a material of such a semiconductor, silicon, germanium, gallium arsenide, gallium phosphide, indium phosphide, or the like can be given. Further, for manufacturing such transistors, a thin semiconductor film or a bulk semiconductor substrate may be used.

Figure 7A:
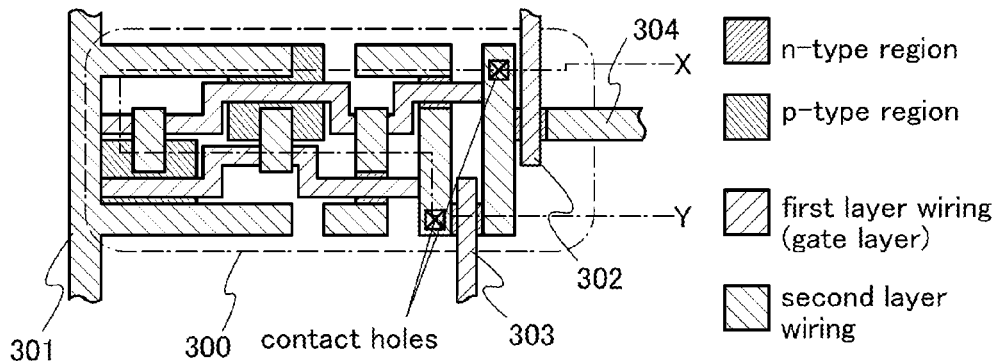
FIGS. 7A to 7D are top views illustrating a structure of a memory element.

An example of circuit arrangement of a memory element in this embodiment is described with reference to FIGS. 7A to 7D. FIG. 7A illustrates a layout of one memory element 300 in a general register. An inverter or the like which is a main component of the memory element 300 may be formed by using a known semiconductor technique. On a semiconductor substrate, an insulator for element isolation (element isolation region), an n-well, a p-well, an n-type region, and a p-type region are formed. A first layer wiring which serves as a gate layer is formed thereover, and then a second wiring layer is further formed thereover.

A part of the first layer wiring is a Sig. 1 wiring 302 for supplying a signal Sig1, and another part thereof is a Sig. 2 wiring 303 for supplying a signal Sig2. A part of the second layer wiring is a VDD wiring 301 connected to a VDD, and another part thereof is an N wiring 304 for inputting a signal N. In FIG. 7A, positions of contact holes through which a wiring is connected to an upper component are shown. Note that in a circuit using a single crystal semiconductor substrate, the potential VSS is preferably supplied from the semiconductor substrate. Since the circuit layout illustrated in FIG. 7A is publicly known, the description thereof is omitted here.

Figure 7B:
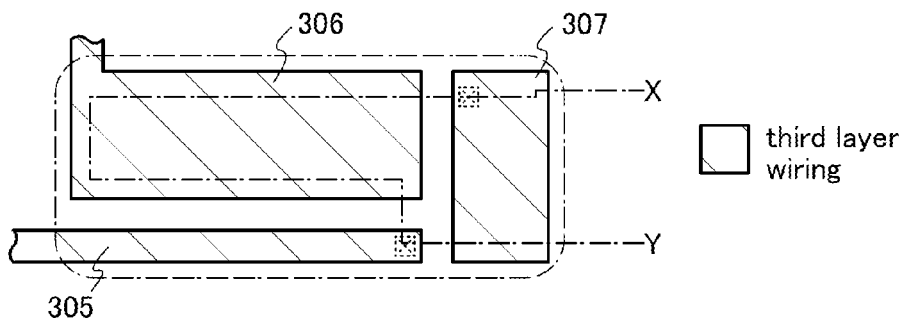

In the memory element of one embodiment of the present invention, a capacitor and a capacitor switching element are added in the circuit illustrated in FIG. 7A. The capacitor and the capacitor switching element both can be formed over the circuit illustrated in FIG. 7A First, a third layer wiring is provided over the circuit illustrated in FIG. 7A, as illustrated in FIG. 7B. A part of the third layer wiring is connected to a part of the second wiring layer through the contact hole, which serves as an OUT wiring 305 for outputting a signal OUT. The other parts of the third layer wiring function as a gate wiring 306 of a transistor as a switching element including an oxide semiconductor and a first capacitor electrode 307.

The gate wiring 306 may be formed to overlap with an area greater than or equal to 80% of an oxide semiconductor region 308 formed later, preferably an area greater than or equal to 85% thereof, more preferably greater than or equal to 90% thereof. A part of the gate wiring 306 serves as a gate electrode of the capacitor switching element 106 illustrated in FIGS. 1A and 1B. Note that the signal Sig3 is supplied to the gate wiring 306.

The first capacitor electrode 307 is connected to a part of the second layer wiring (an input terminal or an output terminal of the inverter) through the contact hole. The first capacitor electrode 307 serves as a part of an electrode of an element which is formed in a later step and corresponds to the capacitor 105 in FIGS. 1A and 1B.

A gate insulator (not illustrated in FIGS. 7A to 7D) and an oxide semiconductor (OS) layer are formed over the third layer wiring. A part of the gate insulator is etched to form an opening which reaches part of the OUT wiring 305.

Figure 7C:
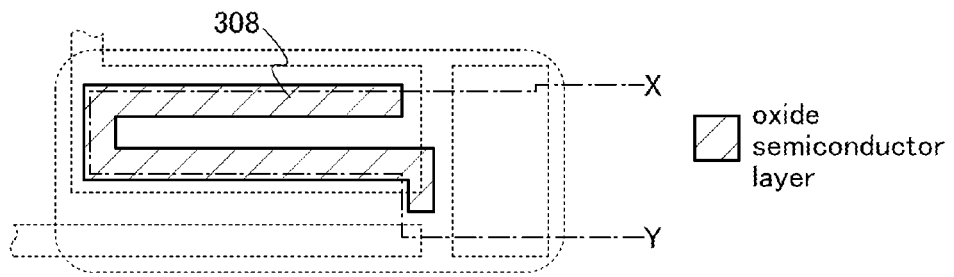

As illustrated in FIG. 7C, the OS layer has at least one hollow portion. For example, the OS layer preferably has an oxide semiconductor region 308 with a J-shape. Alternatively, the oxide semiconductor region 308 may have a U-shape, an L-shape, a V-shape, or a C-shape. Further alternatively, a shape having two or more hollow portions (e.g., an M-shape, an N-shape, an S-shape, a W-shape, a Z-shape, or the like), or a bent shape other than the above may be employed.

As a general definition, on the assumption that a typical length of one memory element is defined as the square root of the area of the memory element, the length from one end portion to the other end portion of the oxide semiconductor region 308 is greater than or equal to the typical length, preferably twice as large as the typical length or more, more preferably five times as large as the typical length or more. Alternatively, the length of the periphery of the oxide semiconductor region 308 is twice as large as the typical length or more, preferably four times as large as the typical length or more, more preferably ten times as large as the typical length or more. Alternatively, a value obtained by dividing the area of the oxide semiconductor region 308 by the length of the periphery may be 0.1 times or less as large as the typical length.

With the above shape, the length from one end portion to the other end portion of the oxide semiconductor region 308 can be larger than the long side of the memory element 300. For example, given that the minimum feature size is 1 F, the length from one end portion to the other end portion of the oxide semiconductor region 308 can be 10 F or more, preferably 20 F or more, more preferably 50 F or more. In a transistor (corresponding to the capacitor switching element 106 in FIGS. 1A and 1B) which is formed using the oxide semiconductor region 308 with the above shape, the channel length can be 10 F or more, preferably 20 F or more, more preferably 50 F or more. In the case of FIG. 7C, the length from one end portion to the other end portion of the oxide semiconductor region 308 is approximately 24 F.

Figure 7D:
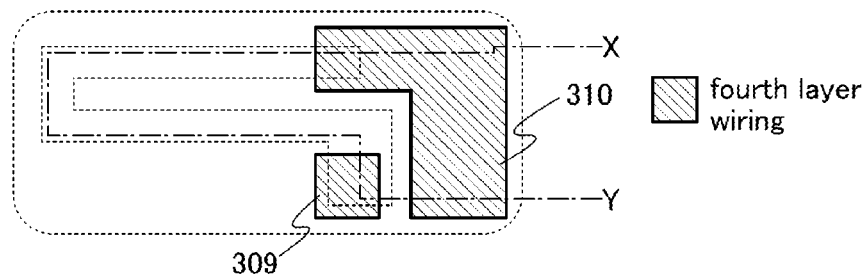

Over the oxide semiconductor layer, a fourth layer wiring is provided as illustrated in FIG. 7D. A part of the fourth layer wiring serves as a source electrode 309 and another part thereof serves as a second capacitor electrode 310. The source electrode 309 is in contact with the OUT wiring 305 through an end of the oxide semiconductor region 308 and the opening mentioned above.

Note that a material with a high work function such as indium nitride may be provided to be in contact with the oxide semiconductor region 308. A portion of the oxide semiconductor region 308, which is in contact with the material with a high work function, becomes depleted, thereby obtaining an effect of reducing off-state current. In particular, in the case where the oxide semiconductor region 308 is thick, the effect is significant. Patent Document 3 can be referred to for the detail.

The second capacitor electrode 310 partly overlaps with the first capacitor electrode 307 to form a part of the capacitor 105 in FIGS. 1A and 1B. In the case of FIG. 7D, the area of electrodes of the capacitor (an area where two electrodes overlap with each other) is approximately 18 $F^2$. Further, the second capacitor electrode 310 is in contact with the other end portion of the oxide semiconductor region 308, which serves as a drain electrode of the transistor to be formed in the oxide semiconductor region.

Figure 8A:
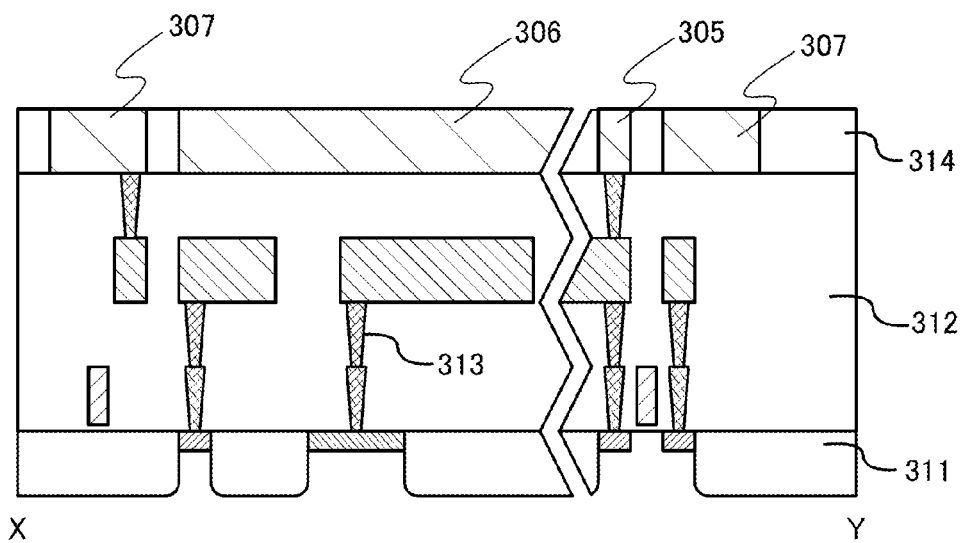
FIGS. 8A and 8B are cross-sectional views illustrating a structure of the memory element.
Figure 8B:
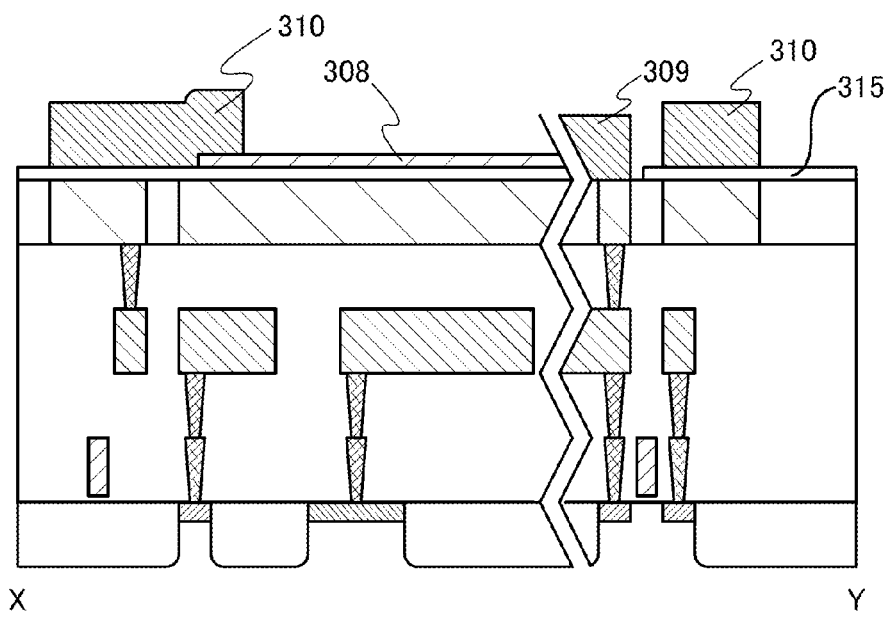

FIGS. 8A and 8B schematically illustrate a cross-sectional structure of the memory element 300 along dashed dotted line X-Y in FIGS. 7A to 7D. Note that in FIGS. 8A and 8B and FIGS. 7A to 7D, the same hatching denotes the same component.

FIG. 8A is a cross-sectional view of a structure in FIG. 7B. An element isolation region 311, the n-type region, and the p-type region are formed in a surface of the semiconductor substrate, and the first layer wiring and the second layer wiring are provided thereover, so that a circuit is formed. An interlayer insulator 312 is provided over the n-type and p-type regions so that the first layer wiring and the second layer wiring are embedded. In the case where electrical connection between the n-type and p-type regions and the second layer wiring is needed, a contact plug 313 is provided. Further, over the interlayer insulator 312, the gate wiring 306 and the first capacitor electrode 307 formed of the third layer wiring are embedded in an embedding insulator 314.

FIG. 8B is a cross-sectional view of a structure in FIG. 7D. Over the structure illustrated in FIG. 8A, a gate insulator 315, an oxide semiconductor layer (such as the oxide semiconductor region 308), and the fourth layer wiring (the source electrode 309 and the second capacitor electrode 310) are further formed. Here, the thickness of the oxide semiconductor layer is 1 nm to 30 nm, preferably 1 nm to 10 nm, and the thickness of the gate insulator 315 is 2 nm to 30 nm, preferably 5 nm to 20 nm.

In this embodiment, since quality of an oxide semiconductor layer is valued, a highly purified oxide semiconductor (film) may be used. Patent Document 4 can be referred to for a method for forming such an oxide semiconductor (film).

Next, an example of operation of the memory element illustrated in FIG. 1A is described. Note that the operation of the memory element can be performed by a method other than the following description.

First, in data writing, the switching element 103 is turned on, the switching element 104 is turned off, and the capacitor switching element 106 is turned off. Then, power supply voltage is applied to the first inverter 101 and the second inverter 102. That is, the potential VDD and the potential VSS are set at appropriate potentials, and a sufficiently large potential difference is generated between the potential VDD and the potential VSS.

A potential of the signal N supplied to the memory element 100 in this state is supplied to the input terminal of the first inverter 101 via the switching element 103, whereby the potential of the output terminal of the first inverter 101 has a phase opposite to the phase of the potential at the signal N. Then, the switching element 104 is turned on and the input terminal of the first inverter 101 is connected to the output terminal of the second inverter 102, whereby data is written into the first inverter 101 and the second inverter 102.

The written data is held by keeping the potential VDD and the potential VSS at appropriate values. At this time, however, leakage current is generated in the first inverter 101 and the second inverter 102 as described above, so that a certain amount of power is consumed.

The potential of the output terminal of the first inverter 101 reflects the data held by the first inverter 101 and the second inverter 102. Therefore, by reading out the potential, the data can be read out from the memory element 100.

Note that in the case where the input data is held by the capacitor 105 in order to reduce power consumption in holding the data, first, the switching element 103 is turned off, the switching element 104 is turned on, and the capacitor switching element 106 is turned on. Consequently, electric charge with an amount corresponding to the value of the data held by the first inverter 101 and the second inverter 102 is accumulated in the capacitor 105, whereby the data is saved in the capacitor 105. After the data is stored in the capacitor 105, the capacitor switching element 106 is turned off, whereby the data stored in the capacitor 105 is held. After the capacitor switching element 106 is turned off, application of power supply voltage is stopped. Note that after the data is stored in the capacitor 105, the switching element 104 may be turned off.

Change in potential in accordance with the above operation is described with reference to FIGS. 4A to 4D. Here, the potential VDD is set at +1 V and the potential VSS is set at 0 V. For ease of explanation, in the description below, the capacitance of the capacitor switching element 106 being on or off is ignored.

Figure 4A:
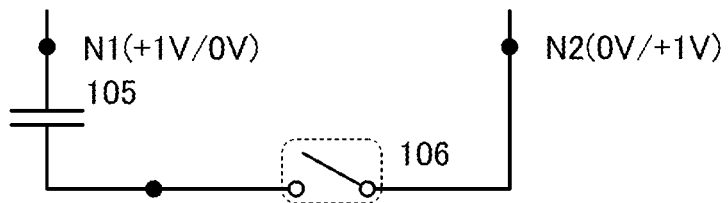
FIGS. 4A to 4D show an example of operation of a memory element.

At first, the potential of the first node N1 is set at +1 V or 0 V in accordance with data as illustrated in FIG. 4A. The potential of the second node N2 is 0 V or +1 V, which is in an inverted phase of the first node N1. Since the capacitor switching element 106 is off, the third node N3 is in a floating state.

Figure 4B:
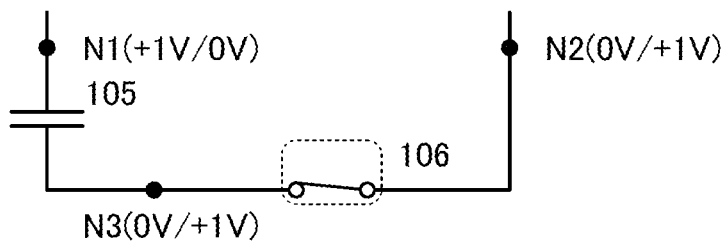

Next, as illustrated in FIG. 4B, the capacitor switching element 106 is turned on, whereby the potential of the third node N3 becomes equal to the potential of the second node N2, i.e., 0 V or +1 V. At this time, between the electrodes of the capacitor 105, electric charge in accordance with the potentials at the first node N1 and the third node N3 is accumulated. That is, data is saved in the capacitor 105. Here, the absolute value of the potential difference between the first node N1 and the third node N3 is 1 V.

Figure 4C:
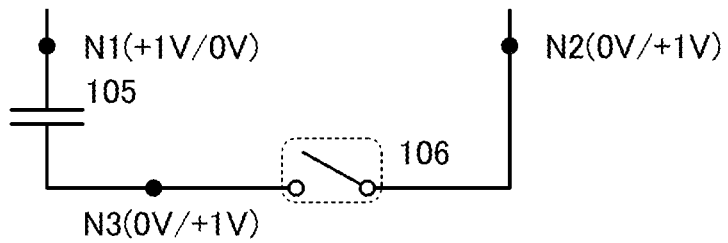

Then, as illustrated in FIG. 4C, the capacitor switching element 106 is turned off, whereby the potential of the third node N3 is kept at 0 V or +1 V.

Figure 4D:
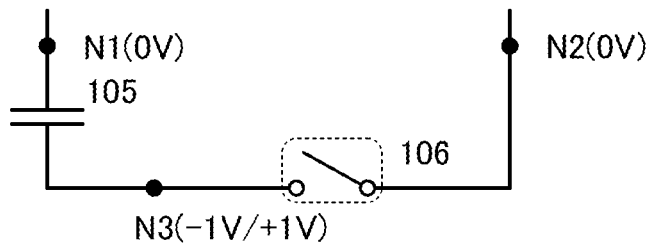

Next, the potential VDD and the potential VSS are set at 0 V. After a time, the potentials of the first node N1 and the second node N2 also become 0 V, as illustrated in FIG. 4D. The potential difference between the third node N3 and the first node N1 is stored; accordingly, the potential of the third node N3 becomes –1 V or +1 V depending on the saved data. In the case where the potential of the first node N1 at the time of saving is +1 V, the potential of the third node N3 at this stage is –1 V. In the case where the potential of the first node N1 at the time of saving is 0 V, the potential of the third node N3 at this stage is +1 V.

Note that the potentials of the first node N1 and the second node N2 at the stage in FIG. 4D are not limited to 0 V and may be +1 V, for example. In that case, when the potential of the first node N1 is +1 V at the time of saving, the potential of the third node N3 is 0 V; and when the potential of the first node N1 is 0 V at the time of saving, the potential of the third node N3 is +2 V. In the case where the potentials of the first node N1 and the second node N2 are set at +2 V, when the potential of the first node N1 is +1 V at the time of saving, the potential of the third node N3 is +3 V.

In the case where the capacitor switching element 106 is an n-channel transistor and the threshold thereof is not so high, when the third node N3 has a negative potential, in order to keep the potential of the third node, the gate of the capacitor switching element 106 needs to have a negative potential in accordance with the third node N3. Generation of a negative potential consumes a certain amount of power, which is not preferable in terms of a reduction in power consumption.

For that reason, the potentials of the first node N1 and the second node N2 are set to be high enough as described above, so that the potential of the third node N3 increases in accordance with the potentials. As a result, the potential of the third node N3 can be kept sufficiently without making the gate of the capacitor switching element 106 have a negative potential.

Alternatively, the potentials of the first node N1 and the second node N2 may be set at an intermediate potential between the potential VDD and the potential VSS at the time when the inverter is active, which is +0.5 V here. In that case, at the time of saving, when the potential of the first node N1 is +1 V, the potential of the third node N3 is –0.5 V; and when the potential of the first node N1 is 0 V, the potential of the third node N3 is +1.5 V.

This setting is convenient because in a restoring method to be described later, the potentials of the first node N1 and the second node N2 are set at +0.5 V. Note that since the third node N3 has a negative potential, it is preferable to avoid keeping this state for a long time.

In such a manner, in the case where the input data is held by the capacitor 105, application of power supply voltage between the first inverter 101 and the second inverter 102 is unnecessary; therefore, the off-state current flowing in the p-channel transistor 107 and the n-channel transistor 108 which are included in the first inverter 101, or via the p-channel transistor 109 and the n-channel transistor 110 which are included in the second inverter 102 can be extremely close to zero.

As a result, power consumption due to the off-state current of the memory element in holding the data can be significantly reduced, and the power consumption of the memory device and further the signal processing circuit including the memory device can be suppressed to be low.

Since the transistor used for the capacitor switching element 106 includes a highly-purified oxide semiconductor in a channel formation region, the off-state current can be less than or equal to 100 zA, preferably less than or equal to 10 zA, more preferably less than or equal to 1 zA. As a result, when the capacitor switching element 106 for which the transistor is used is off, electric charge accumulated in the capacitor 105 is hardly released; therefore, the data is held.

Note that in order to achieve an extremely small off-state current as described above, the potential of the capacitor switching element 106 is required to be sufficiently low in some cases; however, current needed for making the potential of the capacitor switching element 106 low is much smaller than the off-state current. Consequently, substantially no power is consumed.

Next, the case where data stored in the capacitor 105 is restored is described with reference to FIGS. 5A to 5C. First, the switching element 103 is turned off. In addition, the first inverter 101 and the second inverter 102 are set to be in an inactive state. For example, each of the potential VDD and the potential VSS is set at +0.5 V.

Then, the potentials of the first node N1 and the second node N2 are set at +0.5 V. At this time, there is no difference whether the switching element 104 is on or off.

Figure 5A:
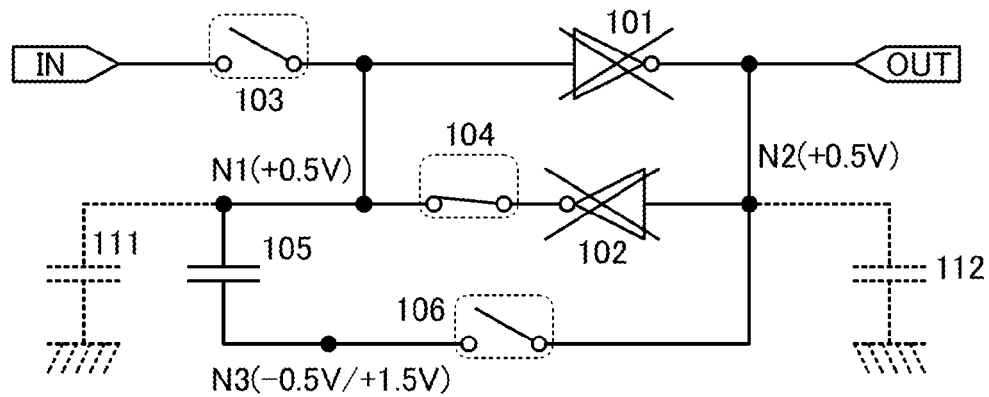
FIGS. 5A to 5C show an example of operation of a memory element.

Since the potential of the first node N1 is +0.5 V, the potential of the third node N3 is either –0.5 V or +1.5 V in accordance with the saved data (see FIG. 5A).

Next, when the capacitor switching element 106 is turned on, electric charge is transferred from the capacitor 105, and the potentials of the third node N3 and the first node N1 are changed. For example, in the case where the potential of the third node N3 is –0.5 V before the capacitor switching element 106 is turned on, since the potential of the third node N3 is lower than the potential of the second node N2 (+0.5 V), by turning on the capacitor switching element 106, the potential of the third node N3 increases and the potential of the second node N2 decreases. On the other hand, in accordance with the increase in the potential of the third node N3, the potential of the other electrode of the capacitor 105 (i.e., the first node N1) is increased.

In contrast, in the case where the potential of the third node N3 is initially +1.5 V, the potential of the third node N3 is decreased. As a result, the other electrode of the capacitor 105 is decreased.

The degree of an increase or a decrease of potential is determined by the ratio between a capacitance of the capacitor 105 and a capacitance 111 of the first node N1 (including parasitic capacitance of the first node N1), and the ratio between the capacitance of the capacitor 105 and a capacitance 112 of the second node N2 (including parasitic capacitance of the second node N2). Here, each of the capacitance 111 and the capacitance 112 is four times the capacitance of the capacitor 105.

In that case, the potential of the first node N1 becomes +0.67 V or +0.33 V. That is, the potential of the first node N1 becomes +0.67 V in the case where the potential at the time of saving is +1 V, whereas the potential of the first node N1 becomes +0.33 V in the case where the potential at the time of saving is 0 V. The potential of the second node N2 becomes +0.33 V or +0.67 V (see FIG. 5B).

Figure 2A:
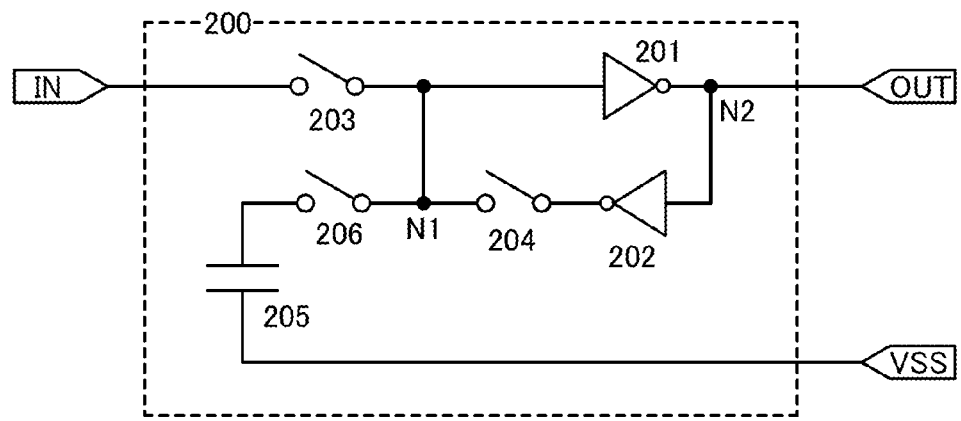
FIGS. 2A and 2B are circuit diagrams of a conventional memory element.
Figure 2B:
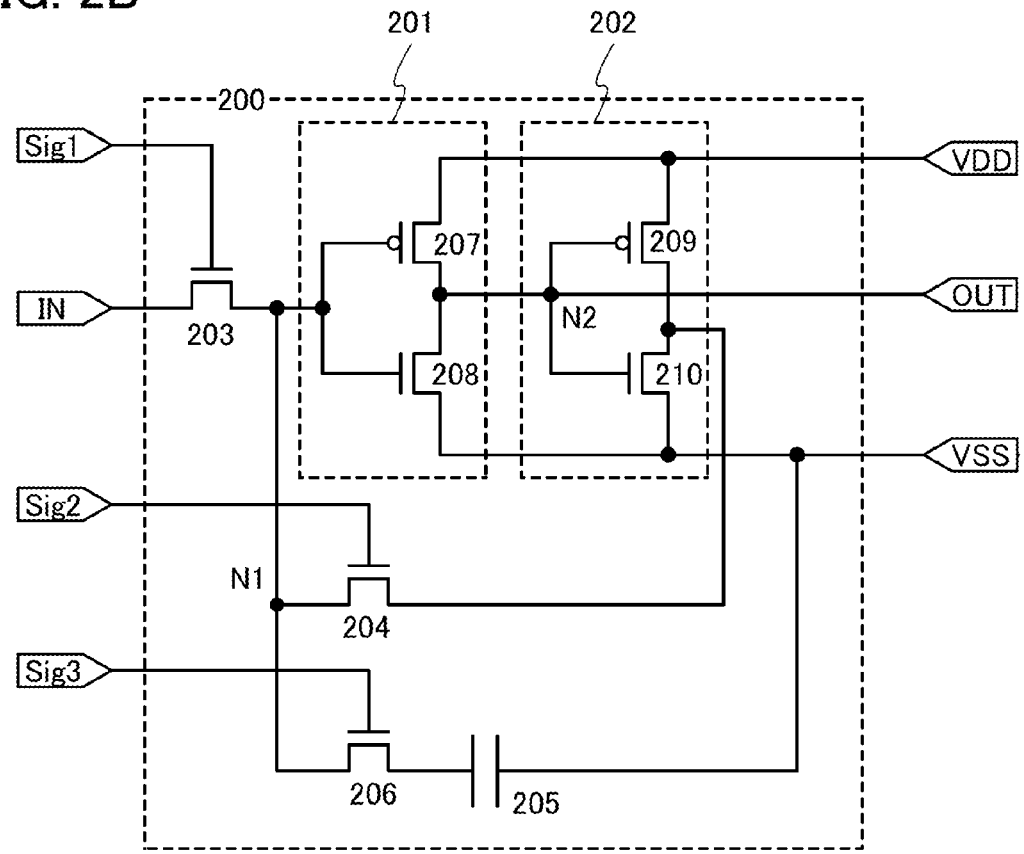

As described above, the absolute value of the potential difference between the first node N1 and the second node N2 is 0.33 V. Note that in the memory element illustrated in FIGS. 2A and 2B, the absolute value of the potential difference between the first node N1 and the second node N2 is 0.1 V. In the case where the second node N2 is also provided with a capacitor switching element and a capacitor as in the first node N1, the absolute value of the potential difference between the first node N1 and the second node N2 is 0.2 V. Even in that case, the absolute value of the potential difference is smaller than that obtained in this embodiment.

Then, the potential VDD and the potential VSS are set at predetermined potentials, whereby the power supply voltage is applied to the first inverter 101 and the second inverter 102. At this stage, the switching element 104 is preferably turned on. Thus, the potential difference between the first node N1 and the second node N2 is increased.

Figure 5B:
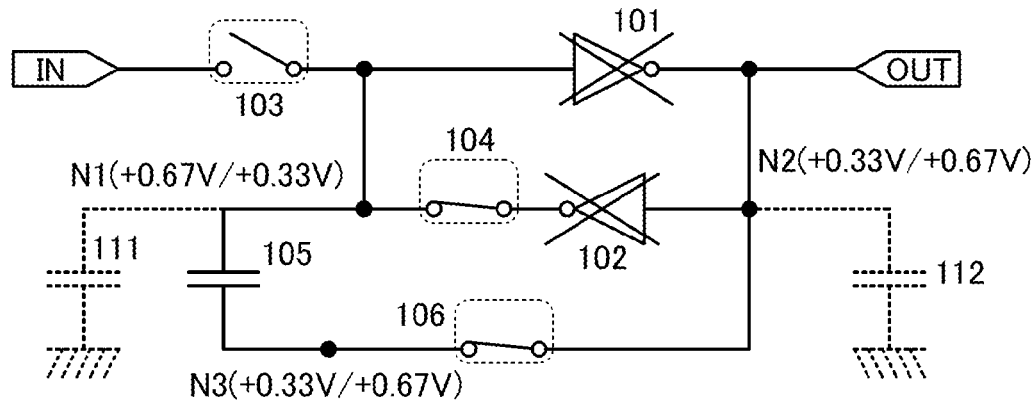
Figure 5C:
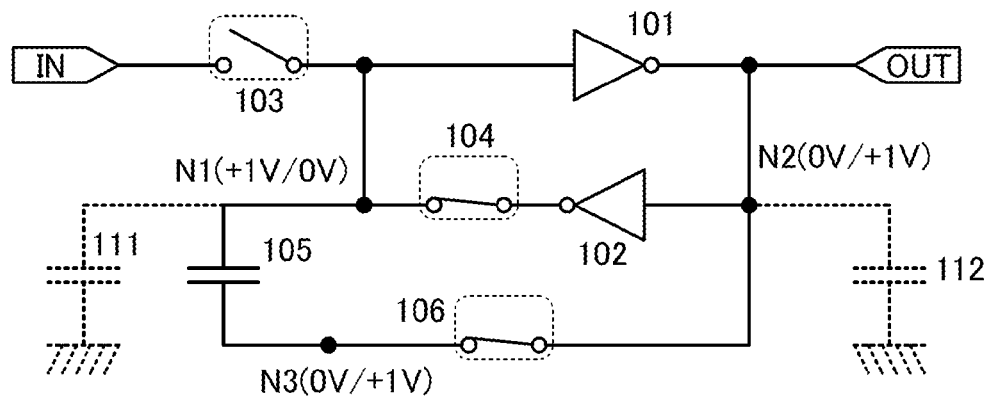

In other words, in the case where the potential of the first node N1 is +0.67 V and the potential of the second node N2 is +0.33 V in the state of FIG. 5B, the potential of the first node N1 becomes +1 V and the potential of the second node N2 becomes 0 V at this stage. Further, in the case where the potential of the first node N1 is +0.33 V and the potential of the second node N2 is +0.67 V in the state of FIG. 5B, the potential or the first node N1 becomes 0 V and the potential of the second node N2 becomes +1 V. As a result, the state where data is written is restored (see FIG. 5C).

As described above, since the potential difference between the first node N1 and the second node N2 is large before the potential difference is increased, an error at the time of data restoring can be prevented. In addition, data restoring can be performed at higher speed. Note that when the capacitance of the capacitor 105 is equal to or larger than the capacitance 111 including parasitic capacitance, data can be restored more surely.

For example, when the capacitance of the capacitor 105 is equal to the capacitance of the capacitance 111 including parasitic capacitance and equal to the capacitance of the capacitance 112 including parasitic capacitance, the potential of the first node N1 in the state of FIG. 5B is +0.83 V or +0.17 V. The potential of the second node N2 becomes +0.17V or +0.83V in a manner opposite to that of the potential of the first node N1. In any case, the potential difference between the first node N1 and the second node N2 is 0.66 V.

Thus, for example, while the switching element 104 remains in an off state, the power supply voltage is applied to the first inverter 101 and the second inverter 102 so that these inverters are activated, whereby a signal can be amplified without malfunction and thus data can be restored.

In the above example, each of the potential VDD, the potential VSS, the potential of the first node N1, and the potential of the second node N2 are set at +0.5 V before the data restoring operation; however, the potentials are not limited thereto and may be another value in the potential range where the inverter is active. In the above example, the potential range where the inverter is active is greater than or equal to 0 V and less than or equal to +1 V. Therefore, each of the potentials may be greater than or equal to 0 V and less than or equal to +1 V, preferably greater than or equal to 0.2 V and less than or equal to 0.8 V.

In this embodiment, the transistor including an oxide semiconductor is described as the capacitor switching element 106, but one embodiment of the present invention is not limited thereto. A transistor including silicon or another semiconductor may be used depending on the capacitance of the capacitor 105 and data holding time.

Embodiment 2

In this embodiment, another example of a memory element included in a memory device of one embodiment of the present invention will be described. Although in the memory element 100 illustrated in FIGS. 1A and 1B, one electrode of the capacitor 105 is connected to the first node N1, the electrode may be connected to another portion.

Figure 3A:
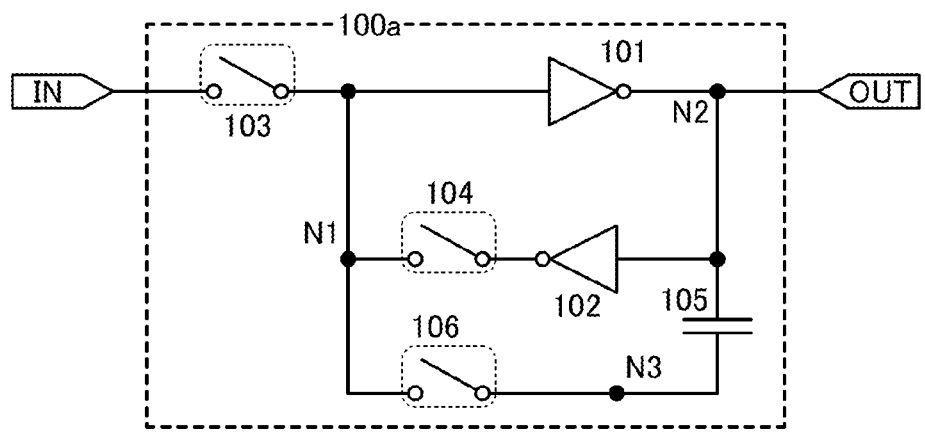
FIGS. 3A and 3B show examples of circuits of a memory element.
Figure 3B:
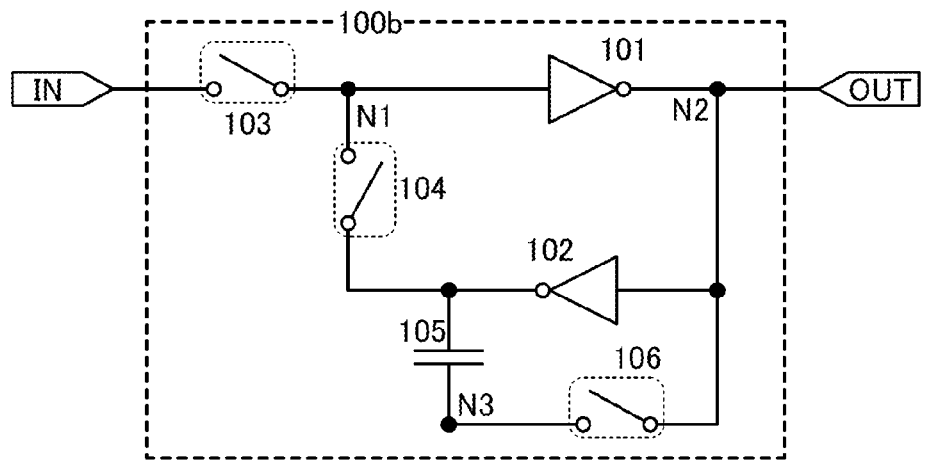

For example, as in a memory element 100a illustrated in FIG. 3A, one electrode of the capacitor 105 may be connected to the second node N2. Alternatively, as illustrated in a memory element 100b illustrated in FIG. 3B, one electrode of the capacitor 105 may be connected between the switching element 104 and the second inverter 102.

In other words, one electrode of the capacitor 105 may be connected to any of the input terminals and the output terminals of the first inverter 101 and the second inverter 102.

One electrode of the capacitor switching element 106 is connected to the other electrode of the capacitor 105. The other electrode of the capacitor switching element 106 is connected to a node whose potential has a phase opposite to that of the potential of the one electrode of the capacitor 105. Data saving and data restoring in such a structure may be performed in a manner similar to that described in Embodiment 1.

Embodiment 3

Figure 6:
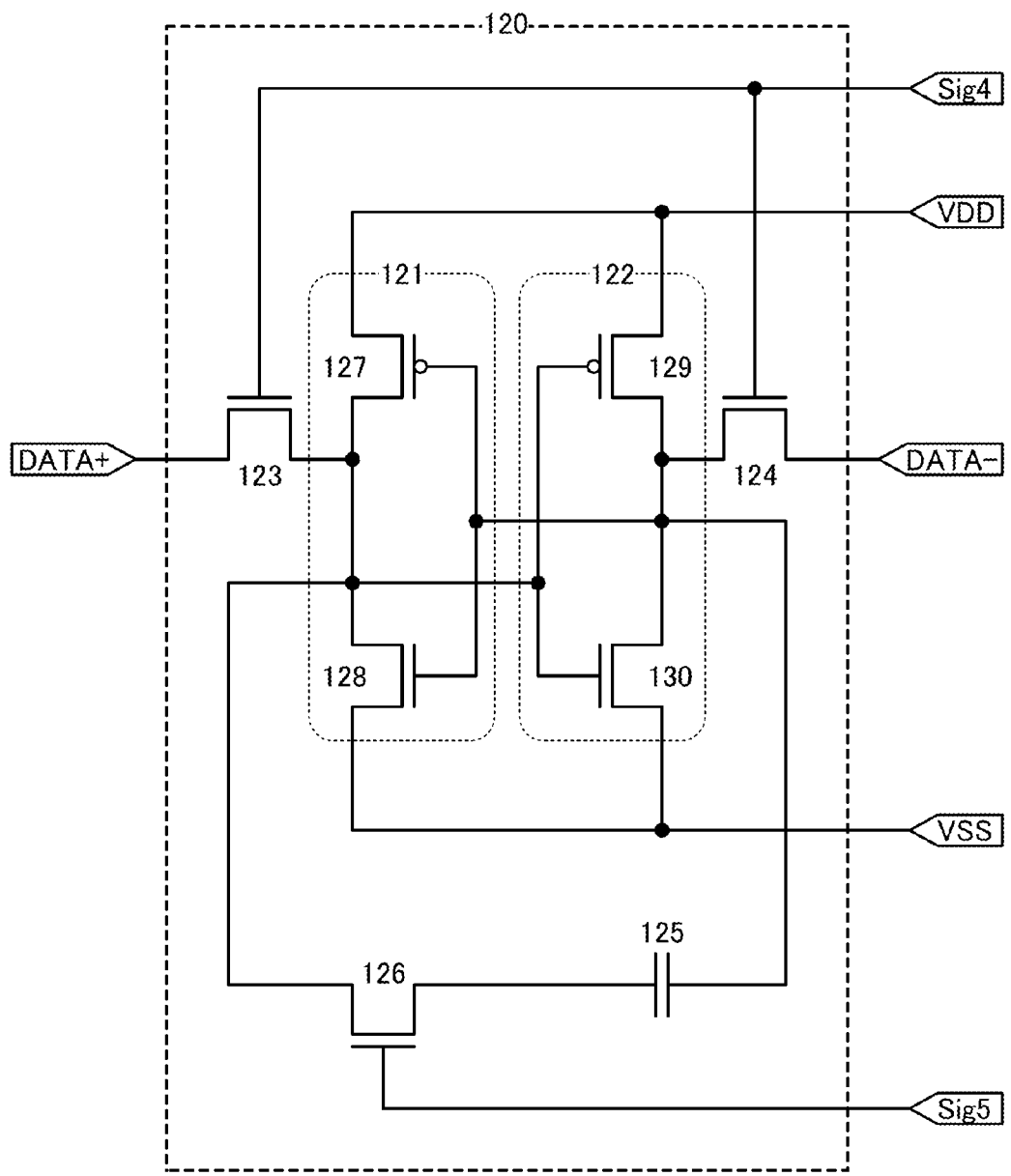
FIG. 6 shows an example of a circuit of a memory element.

In this embodiment, another example of a memory element included in a memory device of one embodiment of the present invention is described. FIG. 6 is a circuit diagram illustrating an example of a memory element of this embodiment. The memory element in FIG. 6 is used in an SRAM.

A memory element 120 illustrated in FIG. 6 includes a first inverter 121 and a second inverter 122 which invert the phase of an input signal and output the signal, a switching element 123, a switching element 124, a capacitor 125, and a capacitor switching element 126.

Here, the first inverter 121 is an inverter including a p-channel transistor 127 and an n-channel transistor 128, and the second inverter 122 is an inverter including a p-channel transistor 129 and an n-channel transistor 130. A source of the p-channel transistor 127 and a source of the p-channel transistor 129 are connected to a node to which the potential VDD is applied. A source of the n-channel transistor 128 and a source of the n-channel transistor 130 are connected to a node to which the potential VSS is applied.

A drain of the p-channel transistor 127 and a drain of the n-channel transistor 128 are connected to a source of the switching element 123. A drain of the p-channel transistor 129 and a drain of the n-channel transistor 130 are connected to a source of the switching element 124.

A drain of the switching element 123 is connected to an input/output terminal /DATA+. A drain of the switching element 124 is connected to an input/output terminal DATA−. At the time of data writing, a potential is applied to each of the input/output terminal DATA+ and the input/output terminal DATA−. The phase of the potential applied to the input/output terminal DATA+ is opposite to that of the potential applied to the input/output terminal DATA−. At the time of data reading, the phase of the potential output from the input/output terminal DATA+ is opposite to that of the potential output from the input/output terminal DATA−.

A gate of the switching element 123 and a gate of the switching element 124 are both controlled by a signal Sig4; therefore, the switching element 123 and the switching element 124 are turned on or off at once.

The above description is the same as that of a memory element included in a general SRAM. In this embodiment, the capacitor 125 and the capacitor switching element 126 are connected in series, and one terminal of a circuit including the capacitor 125 and the capacitor switching element 126 is connected to the output terminal of the first inverter 121 and the other terminal of the circuit is connected to the output terminal of the second inverter 122. A gate of the capacitor switching element 126 is controlled by a signal Sig5.

In a state where an appropriate potential difference exists between the potential VDD and the potential VSS, data is stored in a flip-flop circuit including the first inverter 121 and the second inverter 122.

In order that the potential difference between the potential VDD and the potential VSS is set at 0 V for a reduction in power, data stored before that time in the memory element 120 is transferred to the circuit including the capacitor 125 and the capacitor switching element 126.

For that purpose, the capacitor switching element 126 is turned on in a state where the switching element 123 and the switching element 124 are off. As a result, electric charge in accordance with a potential at an output of the first inverter 121 and a potential at an output of the second inverter 122 is accumulated in the capacitor 125. After that, the capacitor switching element 126 is turned off so that the potential difference between the potential VDD and the potential VSS is 0 V.

To transfer data stored in the capacitor 125 to the flip-flop circuit including the first inverter 121 and the second inverter 122, the potential VDD and the potential VSS are set at the same potential, and then, the capacitor switching element 126 is turned on. The result is that a difference is generated between a potential at an input of the first inverter 121 and a potential at an input of the second inverter 122.

At almost the same time, a potential difference between the potential VDD and the potential VSS is increased so that the potential VDD and the potential VSS are set at predetermined potentials. As a result, a difference between the potential at the input of the first inverter 121 and the potential at the input of the second inverter 122 is increased, so that the data stored in the capacitor 125 is transferred to the flip-flop circuit including the first inverter 121 and the second inverter 122.

The matter disclosed in this embodiment can be implemented in appropriate combination with the matter described in the other embodiments.

This application is based on Japanese Patent Application serial no. 2011-216194 filed with Japan Patent Office on Sep. 30, 2011, the entire contents of which are hereby incorporated by reference.

What is claimed is:

1. A semiconductor device including a memory element, the memory element comprising:
   a first inverter and a second inverter which are capable of holding data, the first inverter comprising an input terminal electrically connected to an output terminal of the second inverter, and the second inverter comprising an input terminal electrically connected to an output terminal of the first inverter;
   a capacitor; and
   a switching element above at least one of the first inverter and the second inverter, the switching element comprising an oxide semiconductor region,
   wherein the switching element is capable of saving data in the capacitor,
   wherein one of electrodes of the capacitor is electrically connected to the input terminal of one of the first and the second inverters,
   wherein one of a source and a drain of the switching element is electrically connected to the input terminal of the other of the first and the second inverters,
   wherein the other of the electrodes of the capacitor is electrically connected to the other of the source and the drain of the switching element, and
   wherein a phase of a potential of a node to which the one of the electrodes of the capacitor is electrically connected is opposite to a phase of a potential of a node to which the other of the source and the drain of the switching element is electrically connected.

2. The semiconductor device according to claim 1, wherein a channel length of the switching element is greater than or equal to 1 μm.

3. The semiconductor device according to claim 1, wherein the capacitor and the switching element are formed in the same layer.

4. The semiconductor device according to claim 1, wherein one of the first and the second inverters is a clocked inverter.

5. The semiconductor device according to claim 1, wherein the oxide semiconductor region comprises an In—Ga—Zn-based oxide.

6. The semiconductor device according to claim 1, further comprising an arithmetic circuit, wherein the memory element is configured to store data from the arithmetic circuit.

7. The semiconductor device according to claim 6, wherein the semiconductor device is a large scale integrated circuit (LSI) including a central processing unit (CPU), a digital signal processor (DSP), or a micro controller.

8. The semiconductor device according to claim 1, wherein the oxide semiconductor region comprises at least one hollow portion as a channel formation region.

9. A semiconductor device including a memory element, the memory element comprising:
   a first inverter and a second inverter which are capable of holding data, the first inverter comprising an input terminal electrically connected to an output terminal of the second inverter, and the second inverter comprising an input terminal electrically connected to an output terminal of the first inverter;
   a capacitor; and
   a switching element above at least one of the first inverter and the second inverter, the switching element comprising an oxide semiconductor region, wherein the switching element is capable of saving data in the capacitor, wherein one of electrodes of the capacitor is electrically connected to the output terminal of one of the first and the second inverters, wherein one of a source and a drain of the switching element is electrically connected to the output terminal of the other of the first and the second inverters, and wherein the other of the electrodes of the capacitor is electrically connected to the other of the source and the drain of the switching element.

10. The semiconductor device according to claim 9, wherein the capacitor and the switching element are formed in the same layer.

11. The semiconductor device according to claim 9, wherein one of the first and the second inverters is a clocked inverter.

12. The semiconductor device according to claim 9, wherein the oxide semiconductor region comprises an In—Ga—Zn-based oxide.

13. The semiconductor device according to claim 9, further comprising an arithmetic circuit, wherein the memory element is configured to store data from the arithmetic circuit.

14. The semiconductor device according to claim 13, wherein the semiconductor device is a large scale integrated circuit (LSI) including a central processing unit (CPU), a digital signal processor (DSP), or a micro controller.

15. The semiconductor device according to claim 9, wherein the oxide semiconductor region comprises at least one hollow portion as a channel formation region.

16. A semiconductor device including a memory element, the memory element comprising:
- a first inverter and a second inverter which are capable of holding data, the first inverter comprising an input terminal electrically connected to an output terminal of the second inverter, and the second inverter comprising an input terminal electrically connected to an output terminal of the first inverter;
- a capacitor; and
- a switching element above at least one of the first inverter and the second inverter, the switching element comprising an oxide semiconductor region, wherein the switching element is capable of saving data in the capacitor, wherein one of electrodes of the capacitor is electrically connected to the output terminal of one of the first and the second inverters, wherein one of a source and a drain of the switching element is electrically connected to the input terminal of the one of the first and the second inverters, and wherein the other of the electrodes of the capacitor is electrically connected to the other of the source and the drain of the switching element.

17. The semiconductor device according to claim 16, wherein the capacitor and the switching element are formed in the same layer.

18. The semiconductor device according to claim 16, wherein one of the first and the second inverters is a clocked inverter.

19. The semiconductor device according to claim 16, wherein the oxide semiconductor region comprises an In—Ga—Zn-based oxide.

20. The semiconductor device according to claim 16, further comprising an arithmetic circuit, wherein the memory element is configured to store data from the arithmetic circuit.

21. The semiconductor device according to claim 20, wherein the semiconductor device is a large scale integrated circuit (LSI) including a central processing unit (CPU), a digital signal processor (DSP), or a micro controller.

22. The semiconductor device according to claim 16, wherein the oxide semiconductor region comprises at least one hollow portion as a channel formation region.

\* \* \* \* \*